United States Patent
Bando

(10) Patent No.: US 6,661,091 B1
(45) Date of Patent: Dec. 9, 2003

(54) SEMICONDUCTOR DEVICE

(75) Inventor: Koji Bando, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/298,927

(22) Filed: Nov. 19, 2002

(30) Foreign Application Priority Data

May 17, 2002 (JP) ........................................ 2002-142739

(51) Int. Cl.[7] .............................................. H01L 29/40
(52) U.S. Cl. ........................ 257/723; 257/767; 257/777
(58) Field of Search ................................. 257/778, 723, 257/737, 738, 767, 777

(56) References Cited

U.S. PATENT DOCUMENTS 6,072,243 A * 6/2000 Nakanishi .................. 257/783
6,087,722 A * 7/2000 Lee et al. ................... 257/723
6,441,495 B1 * 8/2002 Oka et al. ................... 257/777

FOREIGN PATENT DOCUMENTS

| JP | 11-330347 | 11/1999 |
| JP | 2000-269409 | 9/2000 |
| JP | 2001-127244 | 5/2001 |

* cited by examiner

*Primary Examiner*—Roy Potter
(74) *Attorney, Agent, or Firm*—McDermott, Will & Emery

(57) ABSTRACT

A semiconductor device comprises a die pad having an opening, a semiconductor chip located in the opening and another semiconductor chip. The semiconductor chip has a terminal surface and a non-terminal surface positioned opposite to the terminal surface. The semiconductor chip has a non-terminal surface facing the non-terminal surface and the die pad and a terminal surface positioned opposite to the non-terminal surface. Thus provided is a semiconductor device having a high degree of freedom in design mounted with semiconductor chips in high density.

8 Claims, 7 Drawing Sheets

SEMICONDUCTOR DEVICE

BACKGROUND OF THE INVENTION

1. Field of the Invention

The present invention generally relates to a semiconductor device, and more specifically, it relates to a semiconductor device having a semiconductor chip fixed to a die pad.

2. Description of the Background Art

A semiconductor device mounted with a plurality of semiconductor chips is referred to as an MCP (multi chip package). In the MCP, the semiconductor chips must be densely mounted on the same package, in order to implement miniaturization or high-speed operability. Japanese Patent Laying-Open No. 2001-127244 discloses such a multi chip semiconductor device.

FIG. 14 is a plan view showing the multi chip semiconductor device disclosed in Japanese Patent Laying-Open No. 2001-127244. FIG. 15 is a sectional view of the multi chip semiconductor device taken along the line XV—XV in FIG. 14.

Referring to FIGS. 14 and 15, the multi chip semiconductor device 101 comprises a plurality of inner leads 103 extending from the outer periphery toward the center and an island 102 formed at the center. Suspended leads 102a extending from four corners for supporting the island 102 and the suspended leads 102a and the inner leads 103 are integrated with each other on the outer periphery to form a frame part (not shown). The island 102, the suspended leads 102a, the inner leads 103 and the frame part form a lead frame. An opening 107 is formed at the center of the island 102.

An upper chip 106 is provided to bridge the opening 107. A lower chip 105 is provided to be stored in the opening 107. The upper and lower chips 106 and 105 are so provided as to set active element surfaces 106a and 105a thereof in the same direction. Bonding wires 104 electrically connect the active element surfaces 106a and 105a of the upper and lower chips 106 and 105 and the inner leads 103 with each other.

In the aforementioned multi chip semiconductor device 101, the upper chip 106 widely covers the active element surface 105a of the lower chip 105. In the active element surface 105a of the lower chip 105, therefore, only regions 105b not overlapping with the upper chip 106 can be connected with the inner leads 103 through the bonding wires 104. Bonding of the multi chip semiconductor device 101 cannot be freely designed but interconnection of the bonding wires 104 may be complicated due to such limitation.

In order to mount semiconductor chips on the multi chip semiconductor device 101, the upper and lower chips 106 and 105 must be so shaped or superposed as to leave the regions 105b not overlapping with the upper chip 106 on the active element surface 105a of the lower chip 105. In the multi chip semiconductor device 101, therefore, the upper and lower chips 106 and 105 are formed to have rectangular surfaces and so provided on the island 102 that the long sides of the rectangular surfaces are orthogonal to each other. When the upper and lower chips 106 and 105 are shaped or superposed in such a limited manner, however, design of the semiconductor device 101 is remarkably limited.

SUMMARY OF THE INVENTION

In order to solve the aforementioned problem, an object of the present invention is to provide a semiconductor device, having a high degree of freedom in design, mounted with semiconductor chips in high density.

The semiconductor device according to the present invention comprises a die pad having an opening, a first semiconductor chip located in the opening and a second semiconductor chip. The first semiconductor chip has a first surface forming a terminal surface and a second surface positioned opposite to the first surface. The second semiconductor chip has a third surface facing the second surface and the die pad and a fourth surface, positioned opposite to the third surface, forming a terminal surface.

According to the semiconductor device having the aforementioned structure, the first and second semiconductor chips are so provided on the die pad as to direct the first and fourth surfaces forming terminal surfaces opposite to each other, whereby the terminal surfaces do not overlap with the first or second semiconductor chip. Therefore, the first and second semiconductor chips can be bonded to each other along the overall first and fourth surfaces forming terminal surfaces. The terminal surfaces not overlapping with the first or second semiconductor chip are not narrowed to restrict the bonding design. Further, the first and the second semiconductor chips can be shaped or combined with no limitation resulting from provision of the terminal surfaces. In addition, the die pad has the opening for locating the first semiconductor chip therein, whereby the total height of the semiconductor device can be reduced due to the overlap of the thicknesses of the opening of the die pad and the first semiconductor chip.

Preferably, the semiconductor device further comprises a bonding wire connected to the first and fourth surfaces, a lead terminal connected to the bonding wire and a resin member provided to cover the first and second semiconductor chips, part of the lead terminal, the bonding wire and the die pad. According to the semiconductor device having this structure, the first and second semiconductor chips are provided on the die pad and the bonding wire is connected to the lead terminal formed independently of the die pad, whereby heat generated in a bonding step can be efficiently radiated from the semiconductor chips. Further, the first and second semiconductor chips mounted on the die pad are improved in torsional strength in mounting. In addition, the bonding wire employed for connecting the first or second semiconductor chip and the lead terminal with each other can absorb an error in the fixed position of the semiconductor chip. Therefore, the degree of freedom in design of the fixed position of the semiconductor chip can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to FIGS. 1 to 13.

(First Embodiment)

Figure 1:
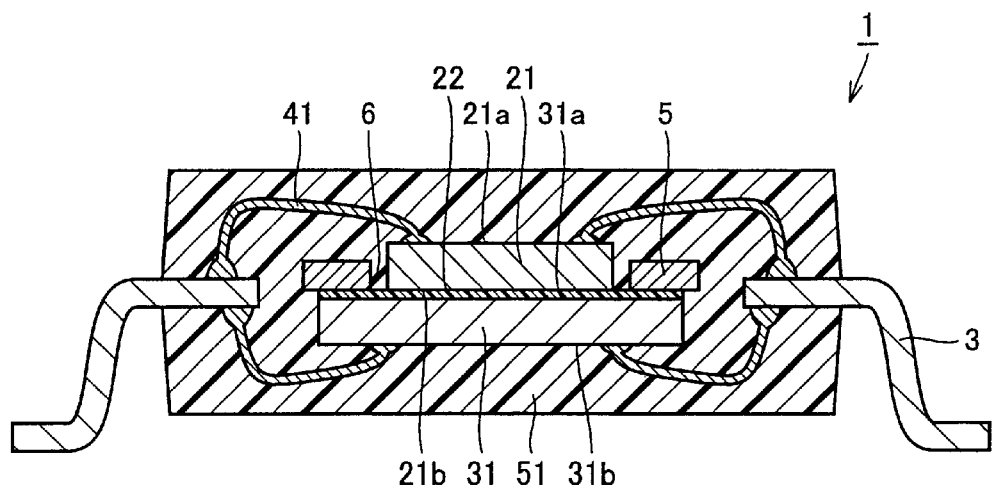
FIG. 1 is a sectional view showing a semiconductor device according to a first embodiment of the present invention.

Referring to FIG. 1, a semiconductor device 1 according to a first embodiment of the present invention comprises a die pad 5, semiconductor chips 21 and 31, lead terminals 3, bonding wires 41 and a sealing resin member 51. The die pad 5 and the lead terminals 3 are formed at prescribed spaces. An opening 6 is formed at the center of the die pad 5. The opening 6, having a rectangular sectional shape, is sized to be capable of storing the semiconductor chip 21. Alternatively, the opening 6 may have a square or polygonal sectional shape in response to the sectional shape of the semiconductor chip 21. The semiconductor chip 31 has a terminal surface 31b and a non-terminal surface 31a formed opposite thereto. The semiconductor chip 31 is provided through a bonding agent 22 so that the non-terminal surface 31a faces a first surface of the die pad 5. The semiconductor chip 21 has a terminal surface 21a and a non-terminal surface 21b formed opposite thereto. The semiconductor chip 21 is provided through the bonding agent 22 so that the non-terminal surface 21b faces the non-terminal surface 31a of the semiconductor chip 31. The semiconductor chip 21 is located in the opening 6 formed in the die pad 5. The semiconductor chip 21 is a flash memory, for example, and the semiconductor chip 31 is a CPU (central processing unit), for example. The bonding agent 22 is prepared from a bonding film or bonding paste.

A plurality of bonding wires 41 electrically connect the terminal surface 21a of the semiconductor chip 21 and first surfaces of the lead terminals 3 with each other. A plurality of bonding wires 41 electrically connect the terminal surface 31b of the semiconductor chip 31 and second surfaces of the lead terminals 3 with each other. The sealing resin member 51 is provided to cover the semiconductor chips 21 and 31, the die pad 5, the bonding wires 41 and parts of the lead terminals 3. The parts of the lead terminals 3 covered with the sealing resin member 51 include all portions bonded to the bonding wires 41. The sealing resin member 51 is prepared by blending epoxy resin, silicone resin or silicone-epoxy hybrid resin with an additive such as a hardener or filler at need. For example, novolac epoxy resin, novolac phenol resin or the like is representatively employed as the epoxy resin. The silicone-epoxy hybrid resin is prepared by hybridizing epoxy resin and silicone resin with each other at a prescribed ratio.

The die pad 5 and the lead terminals 3 are formed with prescribed steps. When the semiconductor chips 21 and 31 are fixed to the die pad 5, therefore, steps between the terminal surface 21a and the first surfaces of the lead terminals 3 and those between the terminal surface 31b and the second surfaces of the lead terminals 3 are equal to each other. Thus, the sealing resin member 51 can have a uniform thickness with reference to the first and second surfaces of the lead terminals 3. However, these steps, arbitrarily decided in response to the shape of the bent lead terminals 3 or the thicknesses of the semiconductor chips 21 and 31, are not restricted to those shown in FIG. 1. The steps may not be provided regardless of the object thereof.

The semiconductor device 1 according to the first embodiment of the present invention comprises the die pad 5 having the opening 6, the semiconductor chip 21 serving as the first semiconductor chip located in the opening 6 and the semiconductor chip 31 serving as the second semiconductor chip. The semiconductor chip 21 has the terminal surface 21a serving as the first surface forming a terminal surface and the non-terminal surface 21b serving as the second surface positioned opposite to the terminal surface 21a. The semiconductor chip 31 has the non-terminal surface 31a serving as the third surface facing the non-terminal surface 21b and the die pad 5 and the terminal surface 31b serving as the fourth surface, positioned opposite to the non-terminal surface 31a, forming a terminal surface.

The semiconductor device 1 further comprises the bonding wires 41 connected to the terminal surfaces 21a and 31b, the lead terminals 3 connected to the bonding wires 41 and the sealing resin member 51. The sealing resin member 51 is provided to cover the semiconductor chips 21 and 31, parts of the lead terminals 3, the bonding wires 41 and the die pad 5.

The sealing resin member 51 contains at least single resin selected from a group consisting of epoxy resin, silicone resin and silicone-epoxy hybrid resin.

A method of fabricating the semiconductor device 1 is now described.

Figure 2:
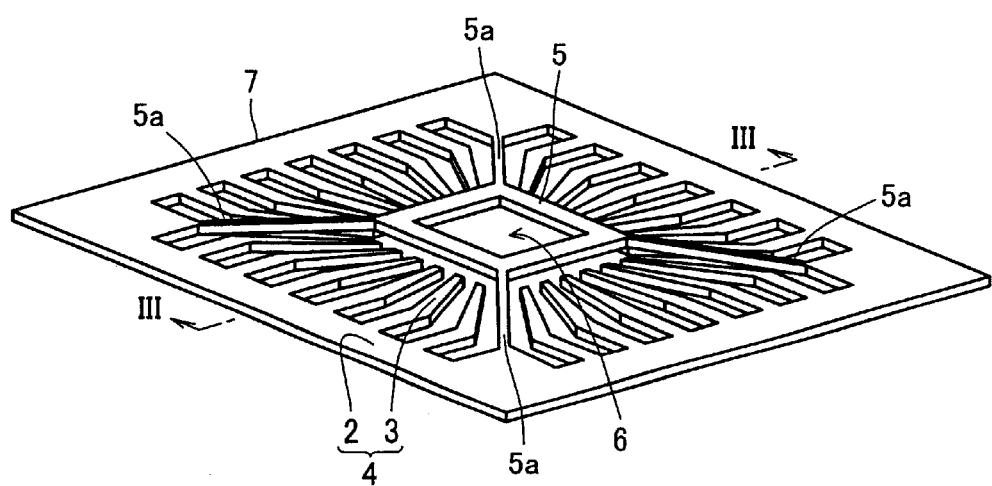
FIGS. 2, 8 and 9 are perspective views

Referring to FIG. 2, a plate 7 of an iron-nickel (Fe—Ni) alloy or a copper (Cu) alloy is prepared. The alloy plate 7 is pressed or etched and worked into a prescribed shape. The worked alloy plate 7 comprises a lead frame 4, formed by a frame 2 and the lead terminals 3, and the die pad 5. Die pad support portions 5a extending from four corners of the frame 2 support the die pad 5. The opening 6 having the rectangular sectional shape is formed at the center of the die pad 5. The opening 6 is sized to be capable of storing the semiconductor chip 21. The plurality of lead terminals 3 are formed to extend from the frame 2 toward the peripheral portions of the die pad 5.

Figure 3:
FIGS. 3 to 7 are sectional views showing steps of a method of fabricating the semiconductor device shown in FIG. 1 respectively.

FIG. 3 is a sectional view taken along the line III—III in FIG. 2. Referring to FIG. 3, the die pad 5 and the lead terminals 3 are formed at spaces with the prescribed steps.

Figure 4:
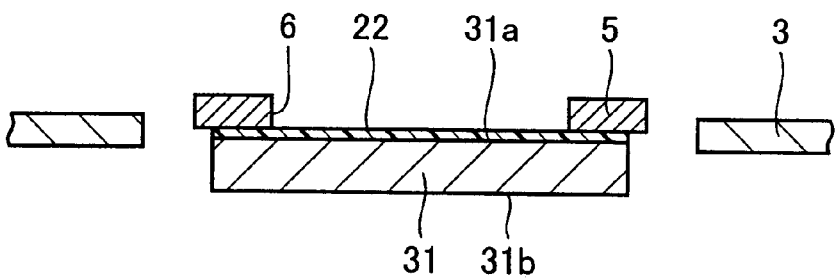

Referring to FIG. 4, the bonding agent 22 is applied to the non-terminal surface 31a of the semiconductor chip 31. The semiconductor chip 31 is fixed to the die pad 5 to bridge the opening 6 formed in the die pad 5.

Figure 5:
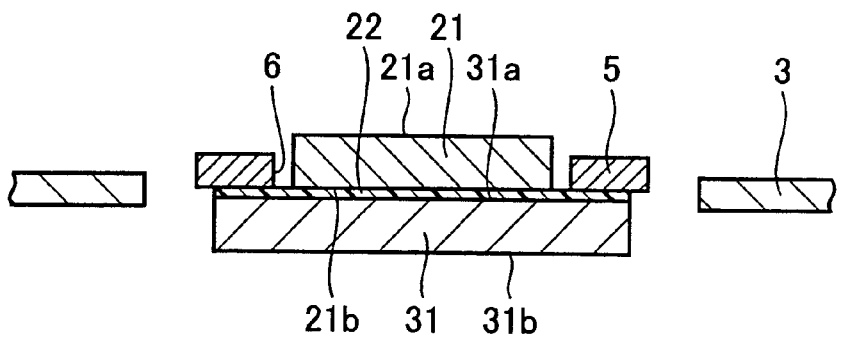

Referring to FIG. 5, the bonding agent 22 is applied also to the non-terminal surface 21b of the semiconductor chip 21. The semiconductor chip 21 is fixed to the non-terminal surface 31a of the semiconductor chip 31 to be located in the opening 6. When the bonding agent 22 is prepared from a bonding film, the semiconductor chip 21 can be fixed to the semiconductor chip 31 without applying the bonding agent 22 to the non-terminal surface 21b of the semiconductor chip 21.

Figure 6:
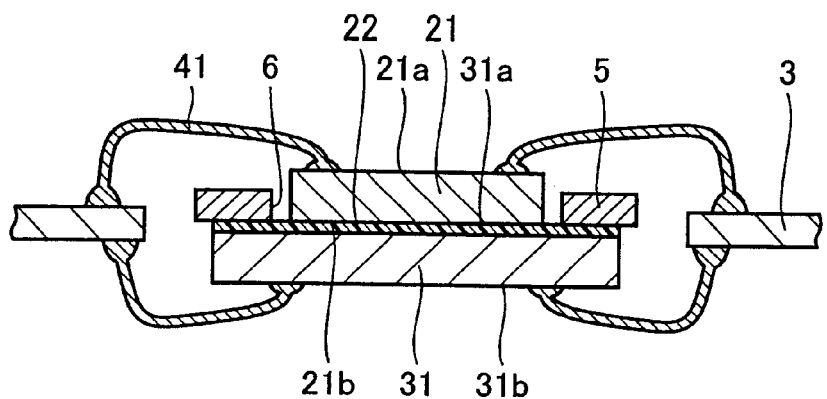

Referring to FIG. 6, the bonding wires 41 electrically connect the terminal surface 21a of the semiconductor chip 21 and the first surfaces of the lead terminals 3 with each other by ultrasonic bonding or the like. The bonding wires 41 are prepared from gold (Au) wires. Similarly, the bonding wires 41 electrically connect the terminal surface 31b of the semiconductor chip 31 and the second surfaces of the lead terminals 3 with each other.

Figure 7:
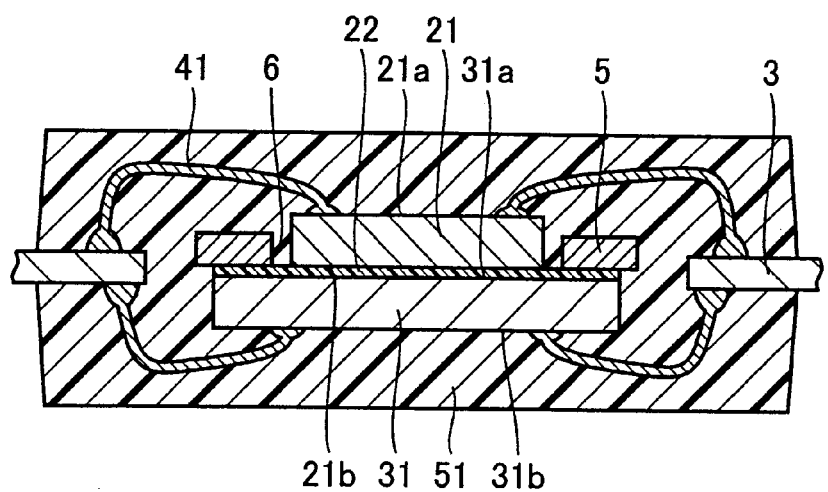

Referring to FIG. 7, the semiconductor chips 21 and 31, the die pad 5, the bonding wires 41 and parts of the lead terminals 3 are covered with the sealing resin member 51.

Figure 8:
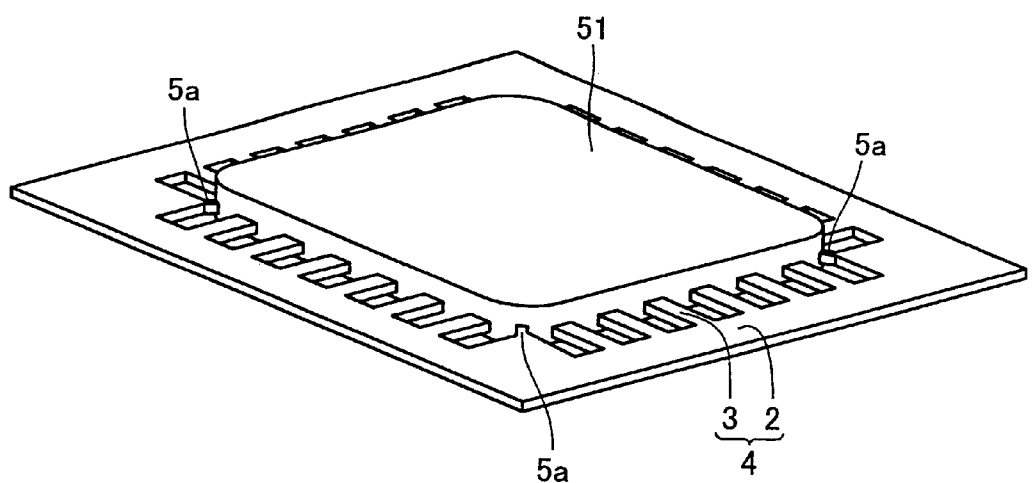

Referring to FIG. 8, the sheath is plated with tin (Sn). The lead terminals 3 are improved in oxidation resistance and corrosion resistance due to the plating.

Figure 9:
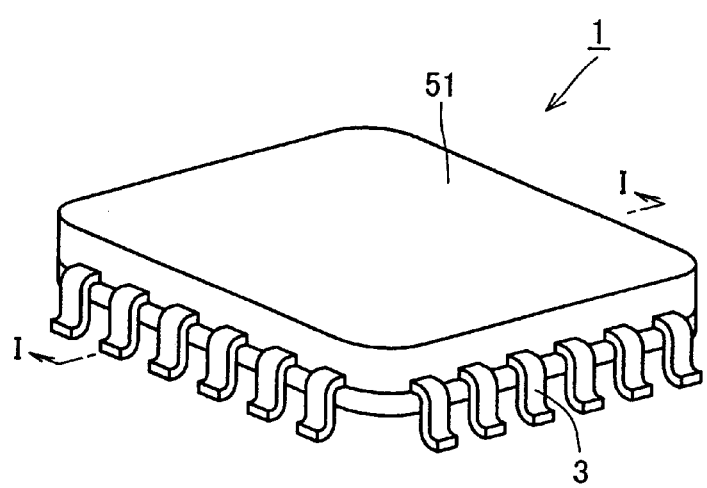

Referring to FIG. 9, the lead terminals 3 are cut out from the frame 2. The die pad support portions 5a provided on the four corners are cut out from the frame 2. The lead terminals 3 are bent in prescribed directions. FIG. 1 is a sectional view taken along the line I—I in FIG. 9. The semiconductor device 1 is completed through the aforementioned steps.

According to the semiconductor device 1 having the aforementioned structure, the terminal surfaces 21a and 31b not overlapping with the semiconductor chip 21 and 31 are not narrowed to restrict wire-bondable regions. Therefore, bonding design is not restricted, and the bonding wires 41 can be prevented from complicated interconnection. Further, the semiconductor chips 21 and 31 can be shaped or superposed with no limitation resulting from provision of the terminal surfaces 21a and 31b.

The semiconductor chip 21 is located in the opening 6 formed in the die pad 5, whereby the total height of the semiconductor device 1 can be reduced due to the thickness of the portion where the semiconductor chip 21 and the die pad 5 overlap with each other. Particularly in the field of a portable telephone, a personal digital assistant (PDA) or a notebook computer, the thickness of a built-in semiconductor device must be reduced. However, simple reduction of the thickness of each component of a semiconductor chip or the like leads to limitation in fabrication. A die pad is provided to fix semiconductor chips in intermediate steps of fabricating a semiconductor device. Therefore, non-terminal surfaces of the semiconductor chips may not be entirely fixed to the die pad but the former may be partially fixed to the latter. According to the first embodiment, therefore, the opening 6 is formed in the die pad 5 for locating the semiconductor chip 21 therein, thereby reducing the thickness of the semiconductor device 1.

When prepared from a bonding film, the bonding agent 22 may not be re-applied to the semiconductor chip 21 for fixing the same, whereby the fabrication steps can be simplified and the quantity of the bonding agent 22 can be reduced.

Further, the semiconductor chips 21 and 31 are fixed to the die pad 5 separated from the lead terminals 3, whereby heat generated in the step of connecting the semiconductor chips 21 and 31 with the lead terminals 3 with the bonding wires 41 can be efficiently radiated. Thus, the semiconductor chips 21 and 31 can be prevented from damage resulting from heat. In addition, the bonding wires 41 employed for connecting the semiconductor chips 21 and 31 with the lead terminals 3 can absorb position errors of the semiconductor chips 21 and 31. Therefore, the semiconductor chips 21 and 31 can be prevented from damage caused in the bonding step due to fabrication errors.

Further, the resin such as epoxy resin contained in the sealing resin member 51 having excellent electric insulation, adhesiveness, chemical resistance or heat resistance can prevent the semiconductor chips 21 and 31 covered therewith from physical or chemical contact with an external device.

(Second Embodiment)

Figure 10:
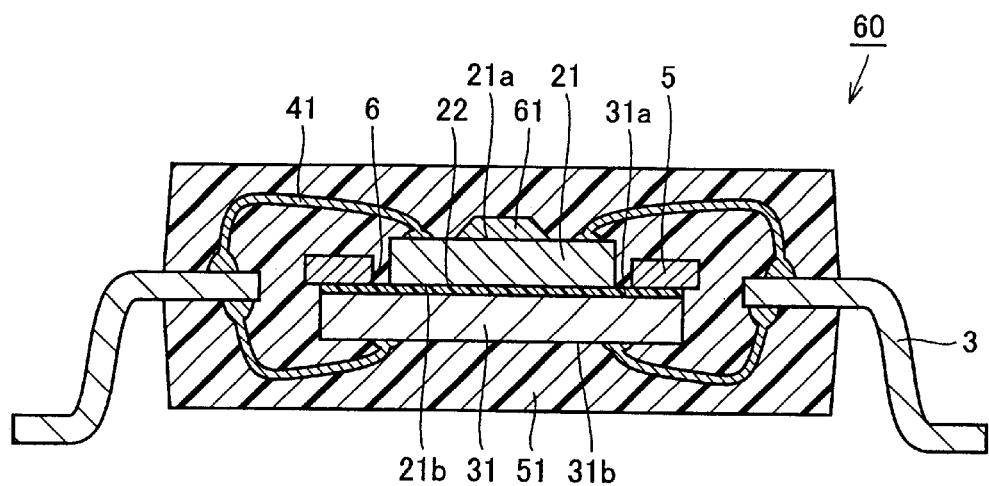
FIG. 10 is a sectional view showing a semiconductor device according to a second embodiment of the present invention.

Referring to FIG. 10, a semiconductor device 60 according to a second embodiment of the present invention further comprises a passive element 61 in addition to components similar to those of the semiconductor device 1 according to the first embodiment. This passive element 61 is provided on a terminal surface 21a of a semiconductor chip 21. The passive element 61 is a resistive element, a capacitive element or an inductive element.

The semiconductor device 60 according to the second embodiment of the present invention further comprises the passive element 61 provided on the terminal surface 21a.

The semiconductor device 60 having the aforementioned structure can attain effects similar to those of the semiconductor device 1 according to the first embodiment. A prescribed circuit structure can be obtained by connecting the passive element 61 to the terminal surface 21a of the semiconductor chip 21 while setting the resistance, capacitance or inductance thereof to a prescribed value.

(Third Embodiment)

Figure 11:
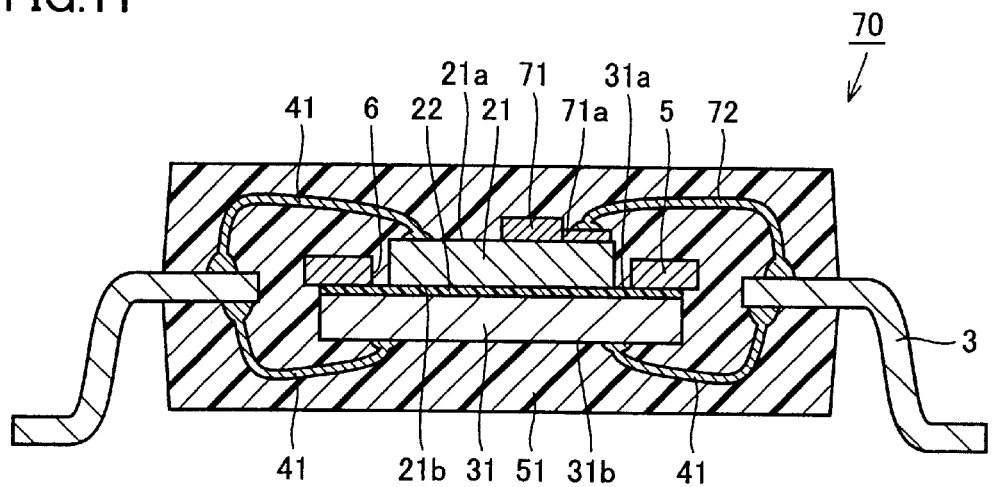
FIG. 11 is a sectional view showing a semiconductor device according to a third embodiment of the present invention.

Referring to FIG. 11, a semiconductor device 70 according to a third embodiment of the present invention further comprises a transistor 71 in addition to components similar to those of the semiconductor device 1 according to the first embodiment. The transistor 71 is provided on a terminal surface 21a of a semiconductor chip 21. A bonding wire 72 electrically connects a lead terminal 71a of the transistor 71 with a lead terminal 3.

The semiconductor device 70 according to the third embodiment of the present invention further comprises the transistor 71 provided on the terminal surface 21a and electrically connected with the lead terminal 3.

The semiconductor device 70 having the aforementioned structure can compensate for insufficient output current of the semiconductor chip 21 in addition to effects similar to those of the semiconductor device 1 according to the first embodiment.

(Fourth Embodiment)

Figure 12:
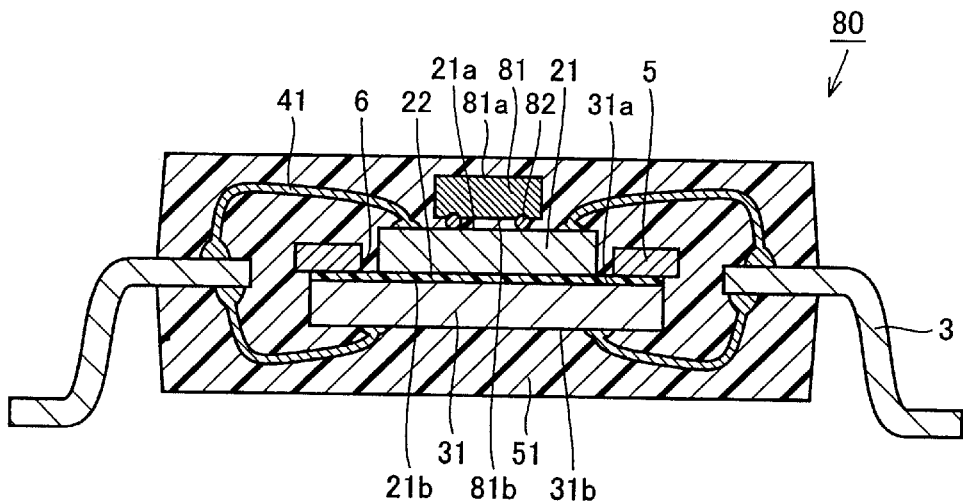
FIG. 12 is a sectional view showing a semiconductor device according to a fourth embodiment of the present invention.

Referring to FIG. 12, a semiconductor device 80 according to a fourth embodiment of the present invention further comprises a semiconductor chip 81 in addition to components similar to those of the semiconductor device 1 according to the first embodiment. The semiconductor chip 81 is provided on a terminal surface 21a of a semiconductor chip 21 through a metal bump 82. The semiconductor chip 81 has a non-terminal surface 81a formed opposite to a terminal surface 81b. The semiconductor chip 81 is so provided that the terminal surface 81b faces the terminal surface 21a of the semiconductor chip 21. A sealing resin member 51 is provided to cover the semiconductor chips 21, 31 and 81, a die pad 5, bonding wires 41 and parts of lead terminals 3.

The semiconductor device 80 according to the fourth embodiment of the present invention further comprises the semiconductor chip 81 serving as the third semiconductor chip mounted on the terminal surface 21a.

According to the semiconductor device 80 having the aforementioned structure, the semiconductor chips 21, 31 and 81 can be further densely mounted in the same package, in addition to effects similar to those of the semiconductor device 1 according to the first embodiment, and miniaturization or high-speed operability of the semiconductor device 80 can be implemented.

(Fifth Embodiment)

Figure 13:
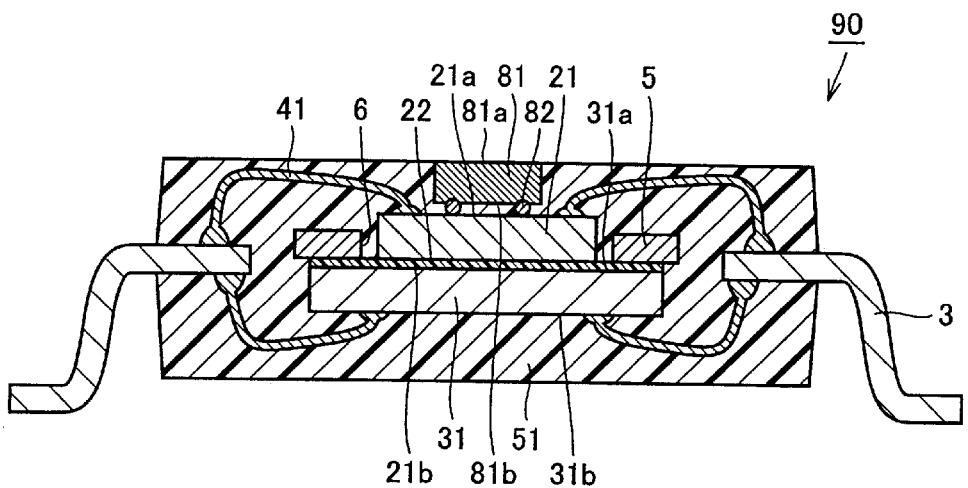
FIG. 13 is a sectional view showing a semiconductor device according to a fifth embodiment of the present invention.
Figure 14:
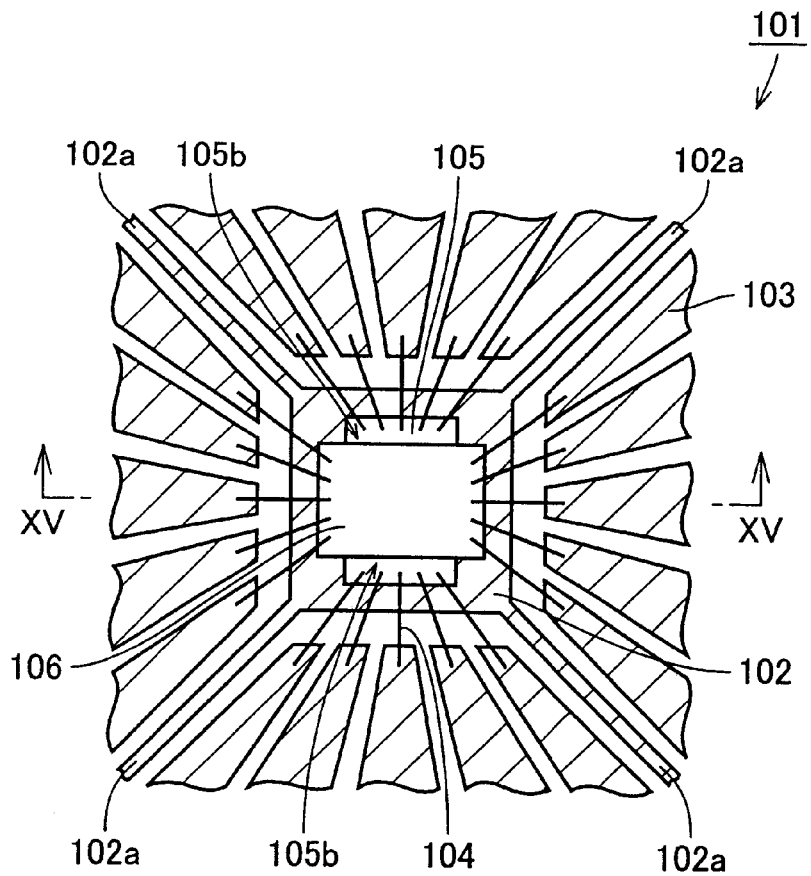
FIG. 14 is a plan view showing a multi chip semiconductor device disclosed in Japanese Patent Laying-Open No. 2001-127244.
Figure 15:
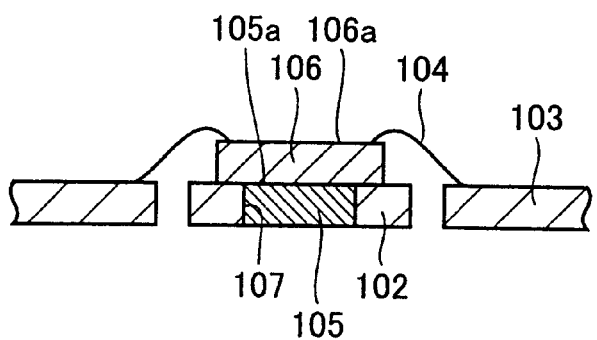
FIG. 15 is a sectional view of the multi chip semiconductor device taken along the line XV—XV in FIG. 14.

Referring to FIG. 13, a semiconductor device 90 according to a fifth embodiment of the present invention is different from the semiconductor device 80 according to the fourth embodiment in the mode of a sealing resin member 51.

A semiconductor chip 81 is provided on a terminal surface 21a of a semiconductor chip 21 through a metal bump 82. The sealing resin member 51 covers portions of the semiconductor chip 81 other than an exposed non-terminal surface 81a, the semiconductor chip 21, a semiconductor chip 31, a die pad 5, bonding wires 41 and parts of lead terminals 3.

The semiconductor device 90 according to the fifth embodiment of the present invention comprises the bonding wires 41 connected to the terminal surface 21a and a terminal surface 31b, the lead terminals 3 connected to the bonding wires 41 and the sealing resin member 51 provided to cover the semiconductor chips 21 and 31, the portions of the semiconductor chip 81, the parts of the lead terminals 3, the bonding wires 41 and the die pad 5. The semiconductor chip 81 includes a terminal surface 81b facing the terminal surface 21a and the non-terminal surface 81a, formed with no terminal, provided independently of the terminal surface 81b. The non-terminal surface 81a of the semiconductor chip 81 is exposed from the sealing resin member 51.

The semiconductor device 90 having the aforementioned structure can attain effects similar to those of the semiconductor device 80 according to the fourth embodiment. The non-terminal surface 81a of the semiconductor chip 81 is exposed from the sealing resin member 51, whereby the total height of the semiconductor device 90 can be further reduced.

Although the present invention has been described and illustrated in detail, it is clearly understood that the same is by way of illustration and example only and is not-to be taken by way of limitation, the spirit and scope of the present invention being limited only by the terms of the appended claims.

What is claimed is:

1. A semiconductor device comprising:

a die pad having an opening;

a first semiconductor chip, having a first surface forming a terminal surface and a second surface positioned opposite to said first surface, located in said opening; and a second semiconductor chip having a third surface facing said second surface and said die pad and a fourth surface, positioned opposite to said third surface, forming a terminal surface.

2. The semiconductor device according to claim 1, further comprising:

a bonding wire connected to said first and fourth surfaces, a lead terminal connected to said bonding wire, and a resin member provided to cover said first and second semiconductor chips, part of said lead terminal, said bonding wire and said die pad.

3. The semiconductor device according to claim 2, wherein said resin member contains at least single resin selected from a group consisting of epoxy resin, silicone resin and silicone-epoxy hybrid resin.

4. The semiconductor device according to claim 2, further comprising a transistor provided on one of said first surface and said fourth surface, wherein said transistor and said lead terminal are electrically connected with each other.

5. The semiconductor device according to claim 1, further comprising a passive element provided on one of said first surface and said fourth surface.

6. The semiconductor device according to claim 1, further comprising a third semiconductor chip mounted on one of said first surface and said fourth surface.

7. The semiconductor device according to claim 6, further comprising:

a bonding wire connected to said first and fourth surfaces, a lead terminal connected to said bonding wire, and a resin member provided to cover said first and second semiconductor chips, part of said third semiconductor chip, part of said lead terminal, said bonding wire and said die pad, wherein said third semiconductor chip includes a terminal surface facing one of said first surface and said fourth surface and a surface, formed with no terminal, provided independently of said terminal surface, and said surface formed with no terminal is exposed from said resin member.

8. The semiconductor device according to claim 7, wherein said resin member contains at least single resin selected from a group consisting of epoxy resin, silicone resin and silicone-epoxy hybrid resin.

* * * * *

UNITED STATES PATENT AND TRADEMARK OFFICE
CERTIFICATE OF CORRECTION

PATENT NO. : 6,661,091 B1
DATED : December 9, 2003
INVENTOR(S) : Koji Bando

It is certified that error appears in the above-identified patent and that said Letters Patent is hereby corrected as shown below:

<u>Title page,</u>
Item [73], Assignee, change "Mitsubishi Denki Kabushiki Kaisha" to -- Renesas Technology Corp. --.

Signed and Sealed this

Tenth Day of February, 2004

JON W. DUDAS
*Acting Director of the United States Patent and Trademark Office*